(12) United States Patent
Chiang et al.

(10) Patent No.: US 12,417,985 B2
(45) Date of Patent: Sep. 16, 2025

(54) SEMICONDUCTOR DEVICE AND METHOD FOR FABRICATING THE SAME

(71) Applicant: UNITED MICROELECTRONICS CORP., Hsinchu (TW)

(72) Inventors: Meng-Ting Chiang, Taichung (TW); Jen-Hsien Chang, Taichung (TW); Kai-Kuang Ho, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 353 days.

(21) Appl. No.: 17/148,624

(22) Filed: Jan. 14, 2021

(65) Prior Publication Data
US 2022/0165684 A1    May 26, 2022

(30) Foreign Application Priority Data
Nov. 23, 2020   (CN) .......................... 202011319465.5

(51) Int. Cl.
| | |
|---|---|
| H01L 23/00 | (2006.01) |
| H01L 21/3065 | (2006.01) |
| H01L 21/78 | (2006.01) |
| H10D 62/10 | (2025.01) |

(52) U.S. Cl.
CPC ........ *H01L 23/562* (2013.01); *H01L 21/3065* (2013.01); *H01L 21/78* (2013.01); *H10D 62/117* (2025.01)

(58) Field of Classification Search
None
See application file for complete search history.

(56) References Cited

U.S. PATENT DOCUMENTS

| | | | |
|---|---|---|---|
| 6,117,347 A | 9/2000 | Ishida | |
| 6,737,606 B2 | 5/2004 | Peng et al. | |
| 8,975,163 B1 | 3/2015 | Lei et al. | |
| 2005/0076719 A1* | 4/2005 | Jakobsen | B81B 7/007 73/718 |
| 2006/0035415 A1* | 2/2006 | Wood | H01L 27/14618 438/126 |
| 2006/0046438 A1* | 3/2006 | Kirby | H01L 29/0657 257/E29.022 |
| 2010/0009519 A1* | 1/2010 | Seddon | H01L 21/6836 438/464 |
| 2010/0059862 A1* | 3/2010 | Seddon | H01L 21/02035 257/618 |
| 2010/0120227 A1* | 5/2010 | Grivna | H01L 21/78 257/E21.214 |
| 2010/0252915 A1* | 10/2010 | Wood | H01L 21/3043 438/690 |
| 2012/0282715 A1* | 11/2012 | Terasaki | B41J 2/1634 438/21 |
| 2012/0299127 A1* | 11/2012 | Fujii | G01L 9/0085 257/415 |

(Continued)

FOREIGN PATENT DOCUMENTS

TW         200743148 A    11/2007

*Primary Examiner* — Erik T. K. Peterson
(74) *Attorney, Agent, or Firm* — WPAT, PC

(57) ABSTRACT

A semiconductor device includes a semiconductor substrate, a circuit structure and a ring-shaped protrusion. The semiconductor substrate has a front surface and a rear surface opposed to each other. The circuit structure is located on the front surface. The ring-shaped protrusion is protruded on the rear surface.

9 Claims, 8 Drawing Sheets

(56) References Cited

U.S. PATENT DOCUMENTS

| | | |
|---|---|---|
| 2013/0161702 A1* | 6/2013 | Chen .................... B81C 1/00246 |
| | | 257/E27.006 |
| 2016/0002026 A1* | 1/2016 | Chodavarapu ...... B81C 1/00301 |
| | | 257/254 |
| 2016/0064604 A1* | 3/2016 | Lin ........................ H05K 3/284 |
| | | 257/98 |
| 2016/0133476 A1 | 5/2016 | Takahashi |
| 2018/0222201 A1* | 8/2018 | Cumbie .................... B41J 2/16 |
| 2019/0080965 A1* | 3/2019 | Seddon ............... H01L 21/0332 |
| 2019/0148306 A1* | 5/2019 | Lin ........................ H01L 21/22 |
| | | 438/530 |
| 2019/0326211 A1* | 10/2019 | Seddon ................... H01L 23/12 |

* cited by examiner

SEMICONDUCTOR DEVICE AND METHOD FOR FABRICATING THE SAME

This application claims the benefit of People's Republic of China application Serial No. 202011319465.5, filed Nov. 23, 2020, the subject matter of which is incorporated herein by reference.

BACKGROUND

Technical Field

The disclosure relates in generally related to a semiconductor device and method for fabricating the same, and more particularly to a semiconductor device having a ring-shaped protrusion and method for fabricating the same.

In the manufacture of semiconductor devices, wafers need to be cut to separate into a plurality of individual dies. However, the stress caused by cutting may cause chipping and warping of the separated dies, and the chipped or warped dies may also be further warped due to the influence of the subsequent bonding wire connection or the shrinkage stress of the packaging material, resulting in a poor subsequent process yield.

Therefore, there is a need of providing an improved semiconductor device and method for fabricating the same to obviate the drawbacks encountered from the prior art.

SUMMARY

One aspect of the present disclosure is to provide a semiconductor device, wherein the semiconductor device includes a semiconductor substrate, a circuit structure and a ring-shaped protrusion. The semiconductor substrate has a front surface and a rear surface opposed to each other. The circuit structure is located on the front surface. The ring-shaped protrusion is protruded on the rear surface.

Another aspect of the present disclosure is to provide a method for fabricating a semiconductor device, wherein the method comprises steps as follows: Firstly, a semiconductor substrate having a front surface and a rear surface opposite to each other is provided. A circuit structure is then formed on the front surface. Subsequently, a cutting process is performed to form at least one front recess on the front surface. An etching process is then performed to form at least one ring-shaped protrusion on the rear surface.

By forming a ring-shaped protrusion on the rear surface, the stress resistance of the semiconductor substrate can be improved which can prevent the semiconductor substrate and the circuit pattern located on the front surface of the semiconductor substrate from being warped due to the adverse impacts caused by the subsequent process, such as bonding stress generated by a wire bonding process or shrinkage stress of the packaging material resulted by a packing process. Whereby a flatter process surface can be provided for the subsequent process and the yield thereof can be thus improved. In addition, plasma etching technology is used to replace the diamond cutter to cut the semiconductor substrate, the problem of chip collapse due to stress damage caused by cutting can be thus improved.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 1D' is a top view illustrating an intermediated process structure of the semiconductor device depicted in FIG. 1D;

FIG. 1E' is a top view illustrating an partial process structure of the semiconductor device depicted in FIG. 1E;

FIG. 1F' is a top view illustrating an intermediate process structure of the semiconductor device depicted in FIG. 1F;

DETAILED DESCRIPTION

Figure 1A:
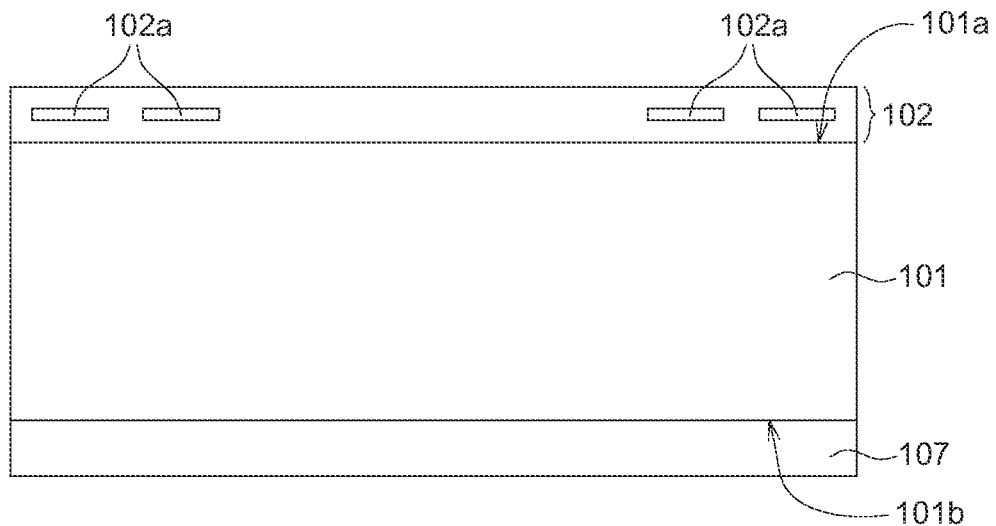
FIGS. 1A to 1F are schematic diagrams of a series of process structures for fabricating a semiconductor device in accordance with one embodiment of the present disclosure.

The embodiments as illustrated below provide a semiconductor device with a ring-shaped protrusion and a method of fabricating the same. The ring-shaped protrusion can provide anti-bending properties to increase the stress resistance of the semiconductor substrate and prevent the semiconductor substrate itself and the circuit pattern located on the semiconductor substrate from being warped due to the adverse impacts caused by the subsequent process, such as bonding stress generated by a wire bonding process or shrinkage stress of the packaging material resulted by a packing process. Whereby, a flatter process surface can be provided for the subsequent process, and the yield thereof can be thus improved. In order to more clearly describe the above and other goals, features and advantages of this disclosure, the following describes the method of fabricating a semiconductor device with ring-shaped protrusions, as a preferred embodiment, and with the accompanying drawings, the detailed description is as follows.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regarded as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Referring to FIGS. 1A to 1F, FIGS. 1A to 1F are schematic diagrams of a series of process structures for fabricating a semiconductor device 100 in accordance with one embodiment of the present disclosure. In one embodiment of the present disclosure, as shown in FIG. 1A, a semiconductor substrate 101 having a front surface 101*a* and a rear surface 101*b* opposite to each other is firstly provided. A circuit structure 102 is then formed on the front surface 101*a* of the semiconductor substrate 101. A first adhesive layer 107 is formed on the rear surface 101*b* of the semiconductor substrate 101.

In one embodiment of the present disclosure, the circuit structure 102 may be a patterned circuit layer formed on the front surface 101*a* of the semiconductor substrate 101. For example, in the present embodiment, the circuit structure 102 at least includes a plurality of circuit pattern units 102*a* with the same circuit layout and arranged adjacently on the front surface 101*a* of the semiconductor substrate 101.

Figure 1B:
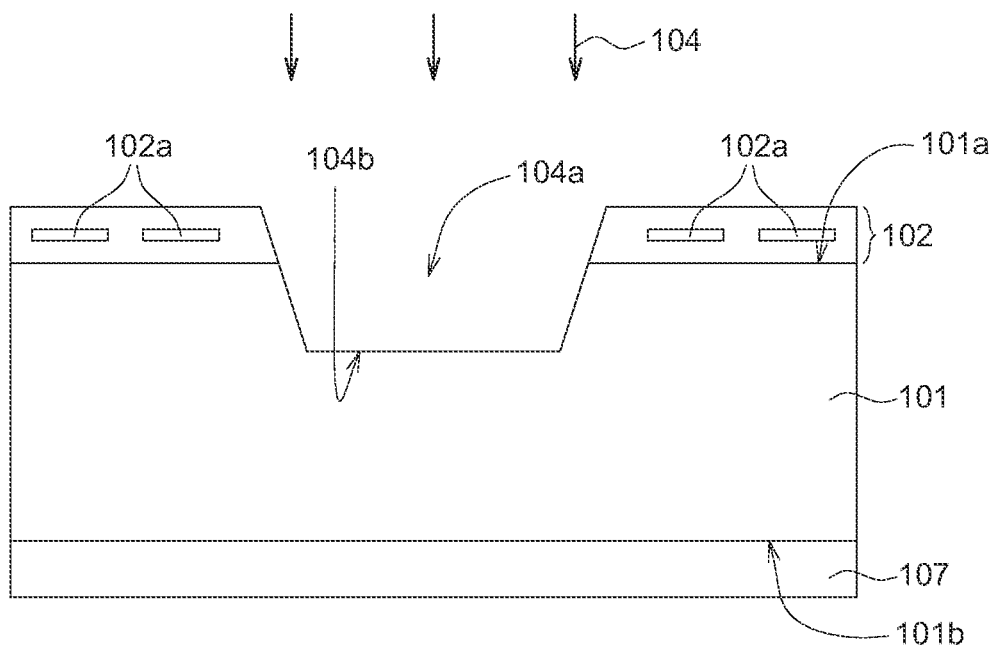
Figure 1C:
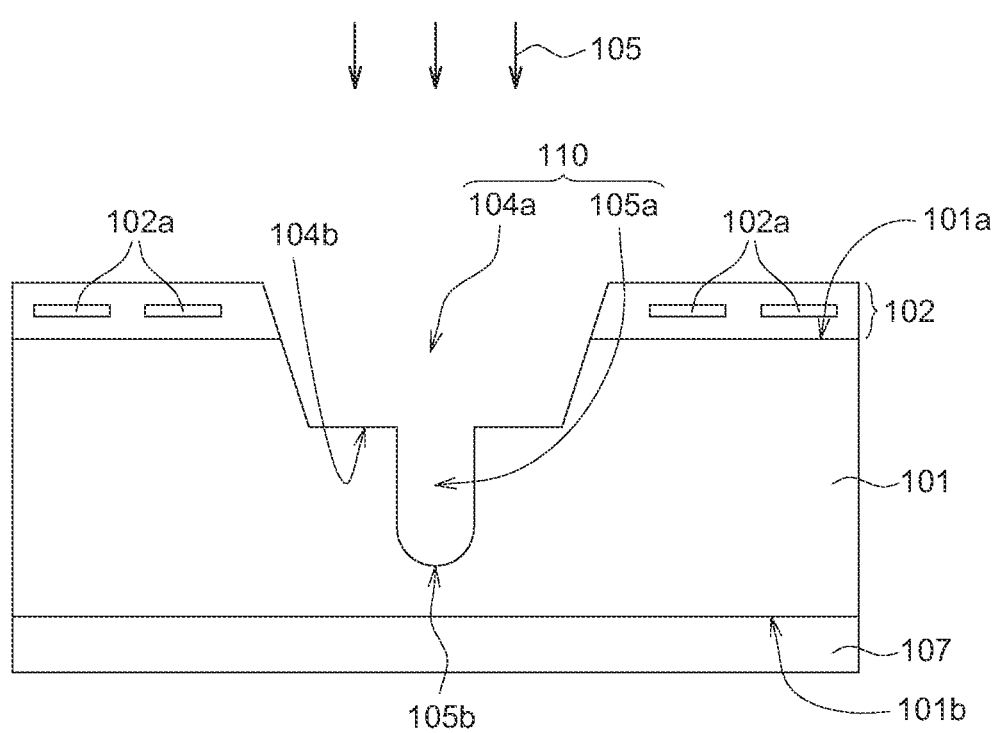

Next, a cutting process is performed. Referring to FIGS. 1B and 1C, in one embodiment of the present disclosure, the cutting process includes forming at least one front recess on the front surface 101*a*. In the present embodiment, the step of performing the cutting process includes performing a laser scribing 104 on the front surface to form a first sub-front recess 104*a* (as shown in FIG. 1B), and then performing a mechanical dicing 105 to form a second sub-front recess 105*a* (as shown in FIG. 1C), wherein the second sub-front recess 105*a* is located at the bottom 104*b* of the first sub-front recess 104*a*; and the combination of the first sub-front recess 104*a* and the second sub-front recess 105*a* forms a front recess 110 of the front surface 101*a*.

It is noted that the order and number of the laser scribing 104 and the mechanical dicing 105 for forming the front recess 110 and the cut size of the first sub-front recess 104*a* and the second sub-front recess 105*a* are not particularly limited. As long as the sub-front recesses (such as the first sub-front recess 104*a* and the second sub-front recess 105*a*) are aligned or overlapped with each other, those process used for forming the same do not depart from the spirit of the cutting process described in the present disclosure.

Figure 1D:
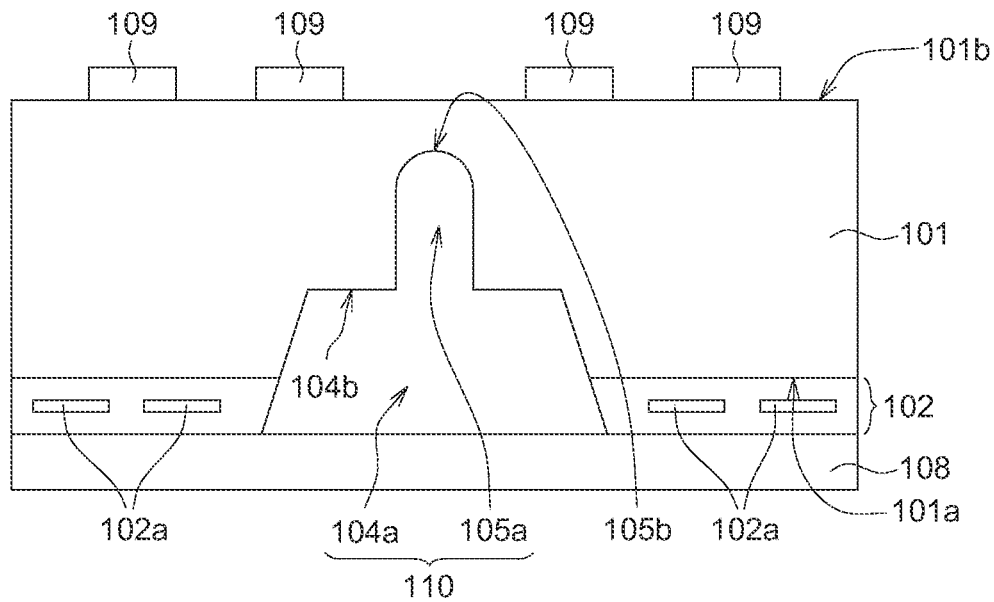
Figure 1D:
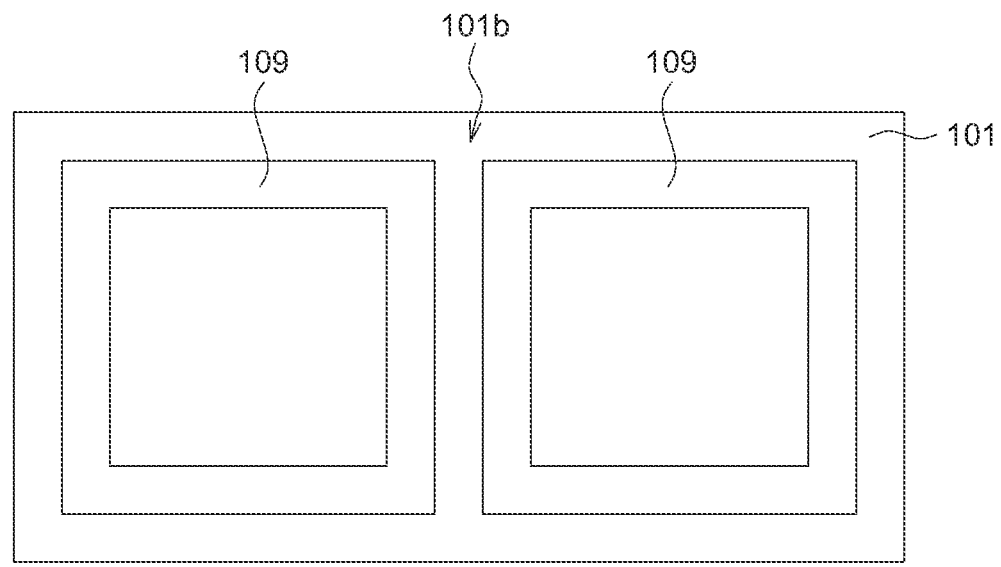

Referring to FIG. 1D, in one embodiment of the present disclosure, the first adhesive layer 107 is peeled from the rear surface 101*b* of the semiconductor substrate 101 after the above-mentioned cutting process is carried out. Subsequently, in one embodiment of the present disclosure, the semiconductor substrate 101 is turned upside down so that the front surface 101*a* faces downward and the rear surface 101*b* faces upward, and then a second adhesive layer 108 is formed on the front surface 101*a* of the semiconductor substrate 101. At least one ring-shaped photoresist 109 is formed on the rear surface 101*b* of the substrate 101. The number of the ring-shaped photoresist 109 may be one, two, three, four or more, for example. For clarity of description, in the present embodiment, as shown in FIG. 1D and FIG. 1D' (top view of FIG. 1D), merely two ring-shaped photoresists 109 are depicted. These two ring-shaped photoresists 109 are respectively located at two opposite sides of the front recesses 110 (such as, the combination of the first sub-front recess 104*a* and both sides of the second sub-front recess 105*a*) and are respectively at least partially overlapped with one of the two adjacent circuit pattern units 102*a*. In another embodiment, only one ring-shaped photoresist 109 can be formed on either side of the front recess 110 (consisting of the first sub-front recess 104*a* and the second sub-front recess 105*a*) on the rear surface 101*b*; and no any other ring-shaped photoresist 109 is formed on the other side of the front recess 110.

Figure 1E:
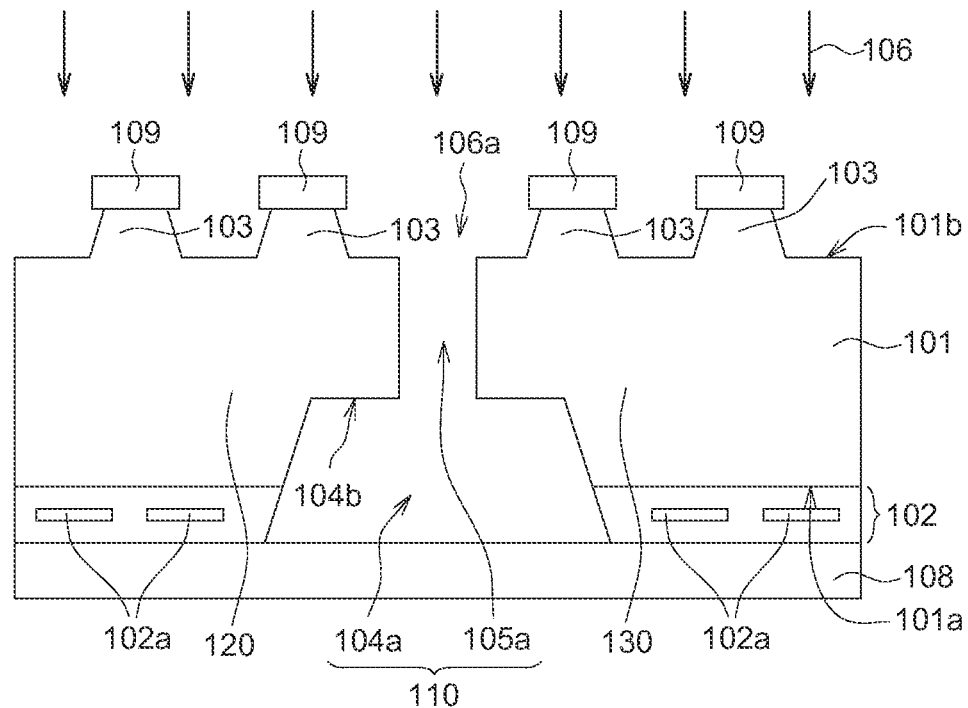
Figure 1E:
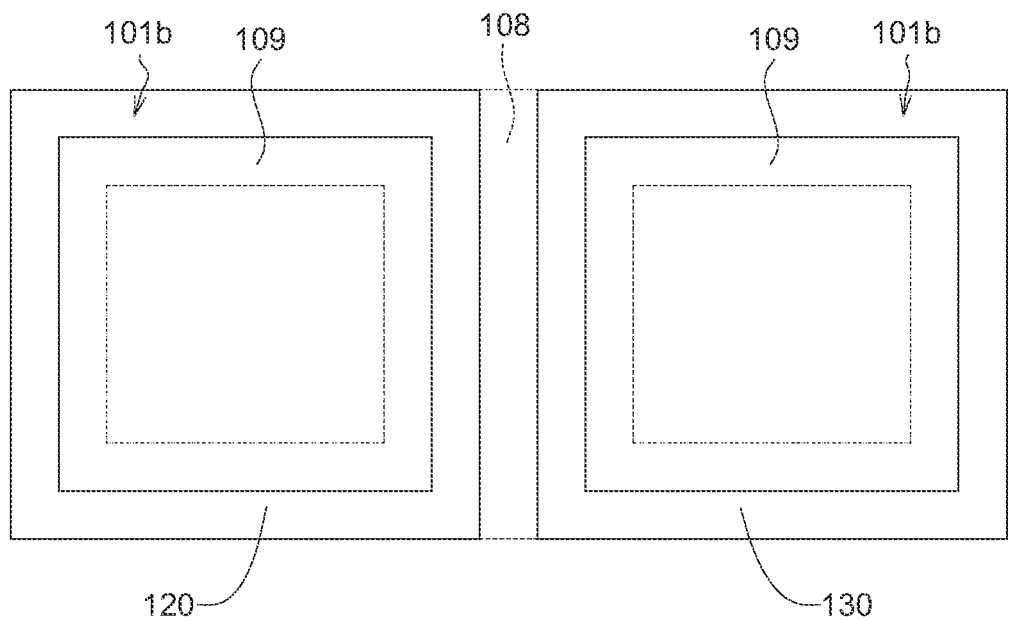

Then, an etching process 106 is performed. Referring to FIG. 1E, at least one ring-shaped protrusion 103 is formed on the rear surface 101*b*. In the present embodiment, an etching process 106 is performed to remove a portion of the semiconductor substrate 101 not covered by the ring-shaped photoresist 109 from the rear surface 101*b*, so that the remaining portion of the semiconductor substrate 101 covered by the ring-shaped photoresist 109 forms a ring-shaped protrusion 103 relative to the etched rear surface 101*b*. In addition, the etching process 106 further includes forming at least one rear recess 106*a* in the etched rear surface 101*b* to make the rear recess 106*a* adjacent to the ring-shaped protrusion 103 and communicating with the front recess 110. As a result, the semiconductor substrate 101 can be divided into a first substrate 120 and a second substrate 130 which are both adhered to the second adhesive layer 108.

After the etching process 106 is performed, the ring-shaped photoresist 109 is peeled off and the second adhesive layer 108 is removed from the front surface 101*a*, the first substrate 120 and the second substrate 130 can be separated from each other. In the present embodiment, referring to FIG. 1F and FIG. 1F' (top view of FIG. 1F), each of the first substrate 120 and the second substrate 130 separated from each other has a ring-shaped protrusion 103 formed by the remaining semiconductor substrate 101 on the rear surface 101*b*.

Specifically, the front surface 101*a* of each of the first substrate 120 and the second substrate 130 includes a circuit pattern unit 102*a* with the same circuit layout. The first substrate 120 and the second substrate 130 separated from each other can be regarded as two divided dies. Taking the first substrate 120 as an example of a semiconductor device, it includes a semiconductor substrate 101, a circuit structure 102 and a ring-shaped protrusion 103. The semiconductor substrate 101 has a front surface 101*a* and a rear surface 101*b* opposite to each other. The circuit structure 102 is located on the front surface 101*a*. The ring-shaped protrusion 103 is protruded on the rear surface 101*b*; wherein a distance PI from a top surface 103*t* of the ring-shaped protrusion 103 to the front surface 101*a* is greater than a thickness T of the semiconductor substrate 101 (also referred to as the height of the vertical wall 101*c*) measured from the front surface 101*a* to the rear surface 101*b*.

Figure 1F:
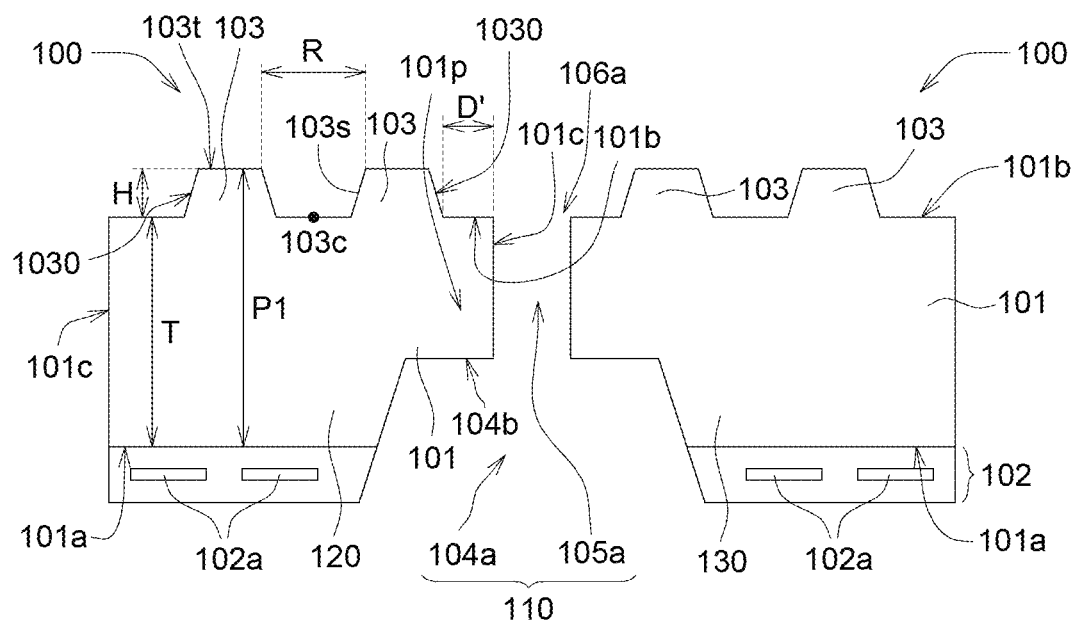
Figure 1F:
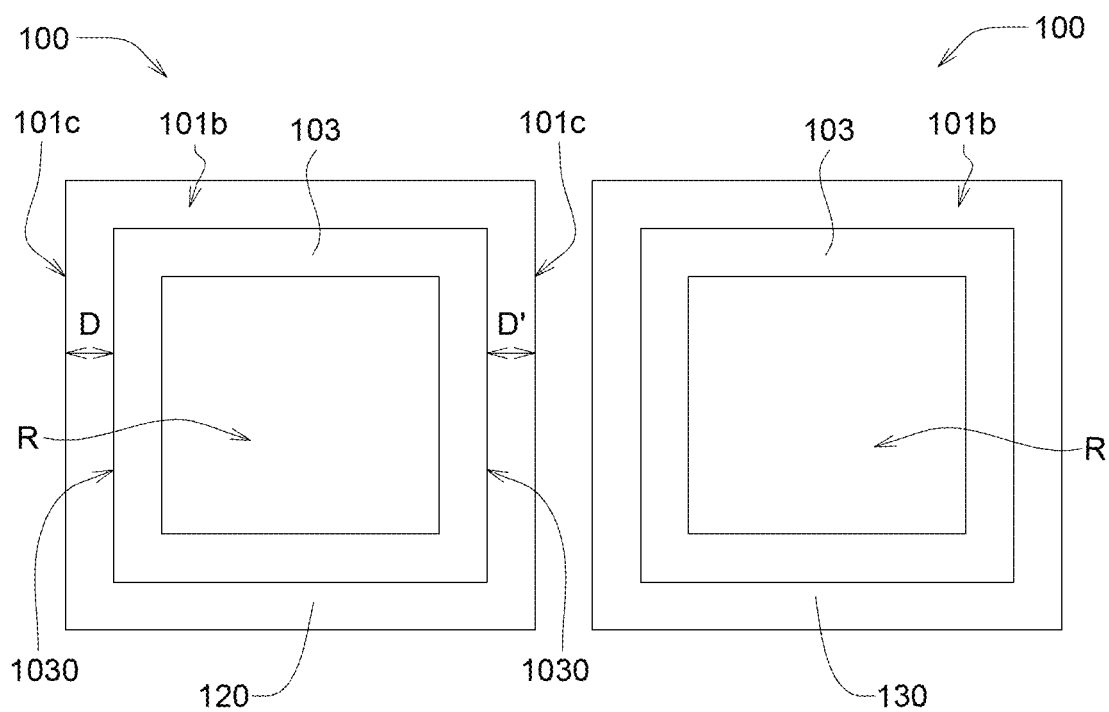

Subsequently, after series of downstream processes (not shown) are performed on the first substrate 120 and the second substrate 130, the preparation of the semiconductor device 100 as shown in FIG. 1F is completed.

In some embodiments of the present disclosure, a thickness T of the semiconductor substrate 101 may be, for example, 100 micrometers, and a height H of the ring-shaped protrusion 103 may be, for example, between 20 micrometers and 50 micrometers. A ratio of the thickness T of the semiconductor substrate 101 to the height H of the ring-shaped protrusion 103 is substantially between 10:1 and 5:1, and may be, for example, 10:1, 9:1, 8:1, 7:1, 6:1 or 5:1. A region R surrounded by the ring-shaped protrusion 103 at least partially overlaps the circuit structure 102. In one embodiment, the ring-shaped protrusion 103 can be arranged in adjacent to a vertical wall 101*c* of the semiconductor substrate 101, and the vertical wall 101*c* connects the front surface 101*a* to the rear surface 101*b*, and an outer outmost edge 1030 of the ring-shaped protrusion 103 away from the center 103*c* is separated from the vertical wall 101*c* for a distance D (or a distance D' in the opposite side). In one embodiment, the front surface 101*a* has a front recess 110, and a bottom 104*b* of the front recess 110 is connected with the vertical wall 101*c*, so that the bottom 104*b* of the front recess 110, the vertical wall 101*c*, and a part of the rear surface 101*b* connected with the vertical wall 101*c* Jointly define one protrusion 101*p*.

Figure 2:
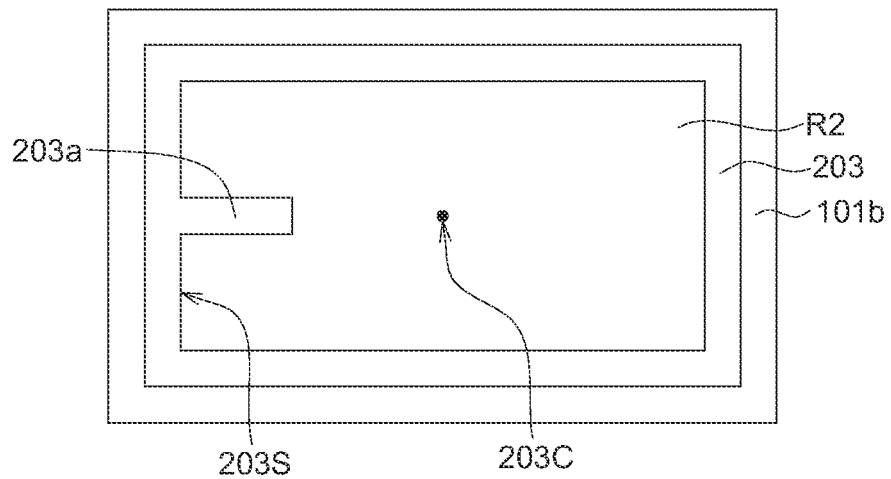
FIG. 2 is a top view of a semiconductor device in accordance with another embodiment of the present disclosure.

It is noted that the structure of the ring-shaped protrusion is not limited to this regard. For example, FIG. 2 is a top view of a semiconductor device 200 in accordance with another embodiment of the present disclosure. The structure of the semiconductor device 200 is generally similar to the semiconductor device 100 shown in FIG. 1F', except that in the present embodiment, the ring-shaped protrusion 203 of the semiconductor device 200 further includes a first extending protrusion 203a extending from an inner edge 203s of the ring-shaped protrusion 203 towards a center 203c of the ring-shaped protrusion 203.

Figure 3:
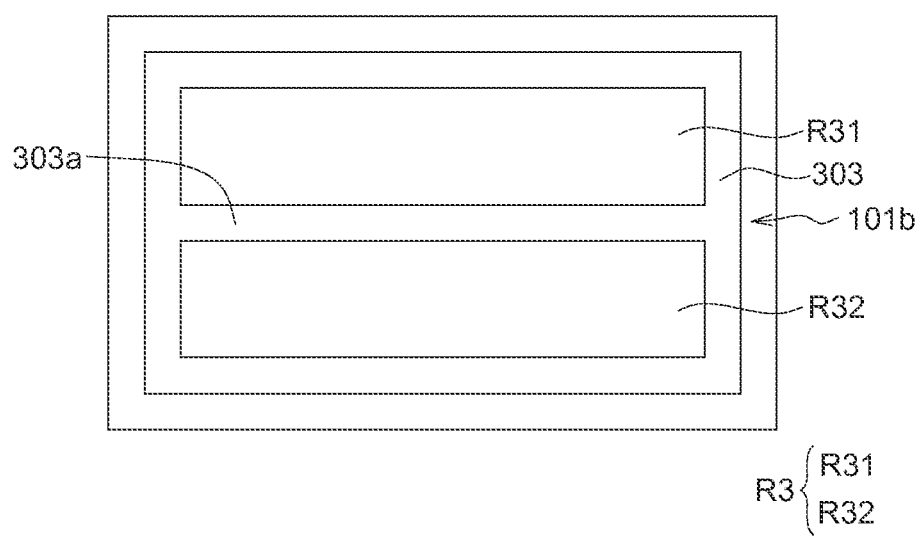
FIG. 3 is a top view of a semiconductor device in accordance with yet another embodiment of the present disclosure.

Referring to FIG. 3, FIG. 3 is a top view of a semiconductor device 300 in accordance with another embodiment of the present disclosure. The structure of the semiconductor device 300 is generally similar to the semiconductor device 200 shown in FIG. 2 except that in the present embodiment, two ends of the first extending protrusion 303a of the ring-shaped protrusion 303 of the semiconductor device 300 are both connected to the inner edge 103s of the ring-shaped protrusion 303, and a region R3 surrounded by the ring-shaped protrusion 303 is divided into two sub-regions R31, R32.

Figure 4:
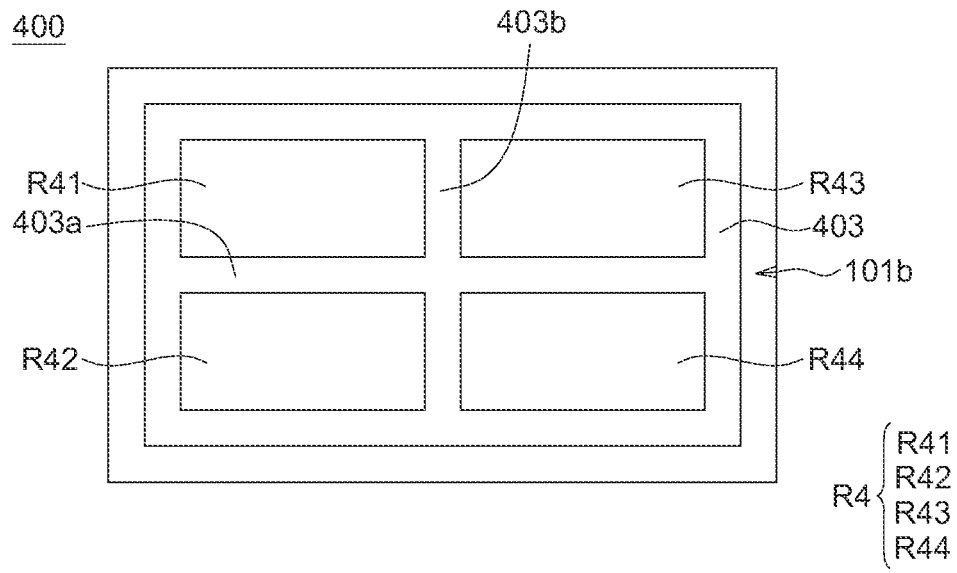
FIG. 4 is a top view of a semiconductor device in accordance with further embodiment of the present disclosure.

Referring to FIG. 4, FIG. 4 is a top view of a semiconductor device 400 in accordance with further embodiment of the present disclosure. The structure of the semiconductor device 400 is generally similar to the semiconductor device 300 shown in FIG. 3, except that in this embodiment, the ring-shaped protrusion 403 of the semiconductor device 400 further includes a second extending protrusion 403b, wherein the first extending protrusion 403a and the second extending protrusion 403b come cross with each other to form a grid structure dividing the region R4 surrounded by the ring-shaped protrusion 403 into a plurality of sub-regions (such as sub-regions R41, R42, R43, R44).

Figure 5:
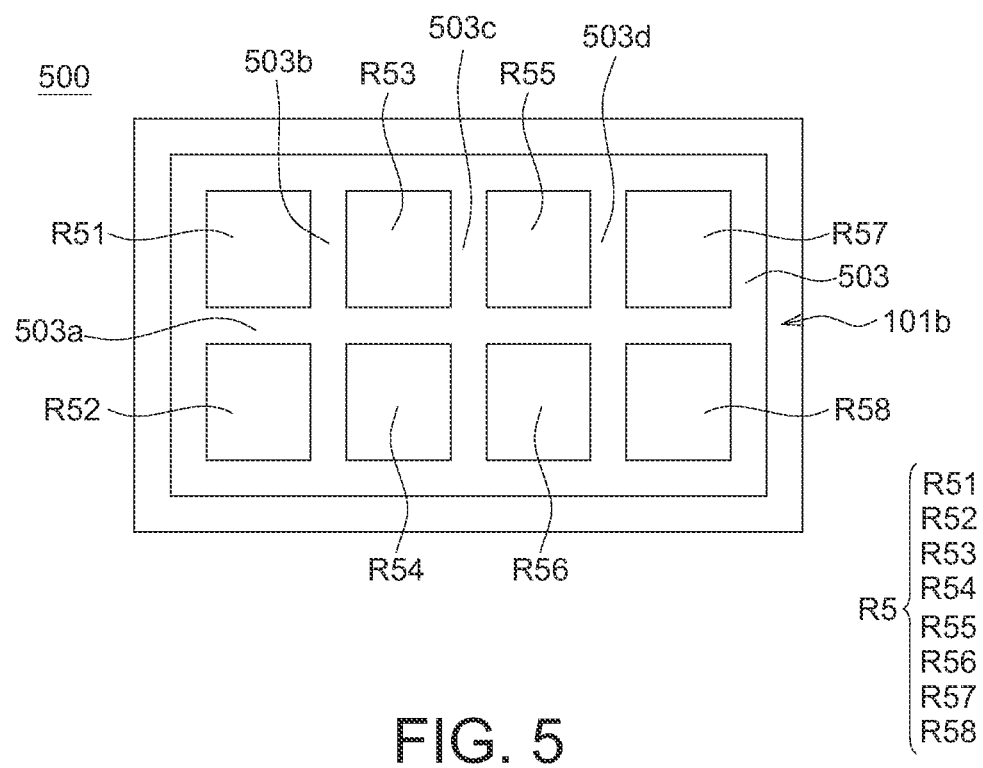
FIG. 5 is a top view of a semiconductor device in accordance with one embodiment of the present disclosure.

Referring to FIG. 5, FIG. 5 is a top view of a semiconductor device 500 in accordance with still further embodiment of the present disclosure. The structure of the semiconductor device 500 is generally similar to the semiconductor device 400 shown in FIG. 4, except that in the present embodiment, the ring-shaped protrusion 503 of the semiconductor device 500 further includes more extending protrusions, such as lateral extending protrusions 503a and longitudinal extending protrusions 503b, 503c, and 503d. Wherein, the lateral extending protrusion 503a and the longitudinal extending protrusions 503b, 503c, 503d come cross with each other to form a grid structure dividing the region R5 surrounded by the ring-shaped protrusion 503 into a plurality of sub-regions (such as sub-regions R51, R52, R53, R54, R55, R56, R57, R58).

Although the shape of the ring-shaped protrusion 103 shown in FIGS. 2 to 5 is square, the shape of the ring-shaped protrusion is not limited to these regards. For example, referring to FIG. 6, the structure of the semiconductor device 600 is generally similar to the semiconductor device 100 depicted in FIG. 1F', except that in the present embodiment, the shape of the ring-shaped protrusion 603 of the semiconductor device 600 can be, for example, a circle.

Figure 6:
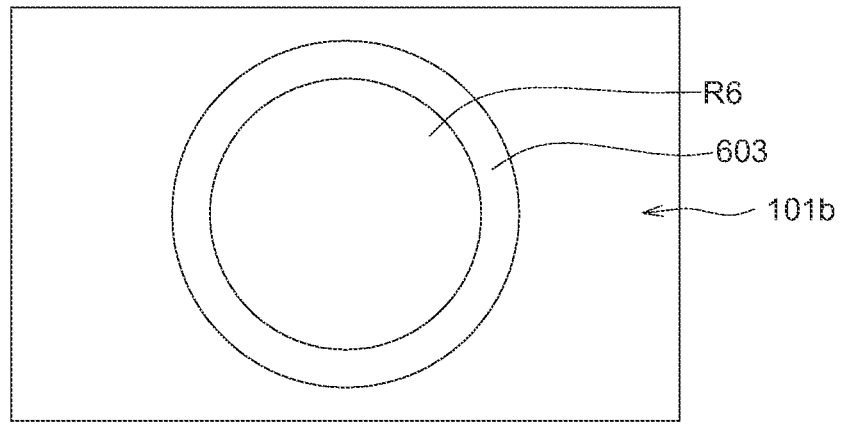
FIG. 6 is a top view of a semiconductor device in accordance with one embodiment of the present disclosure.
Figure 7:
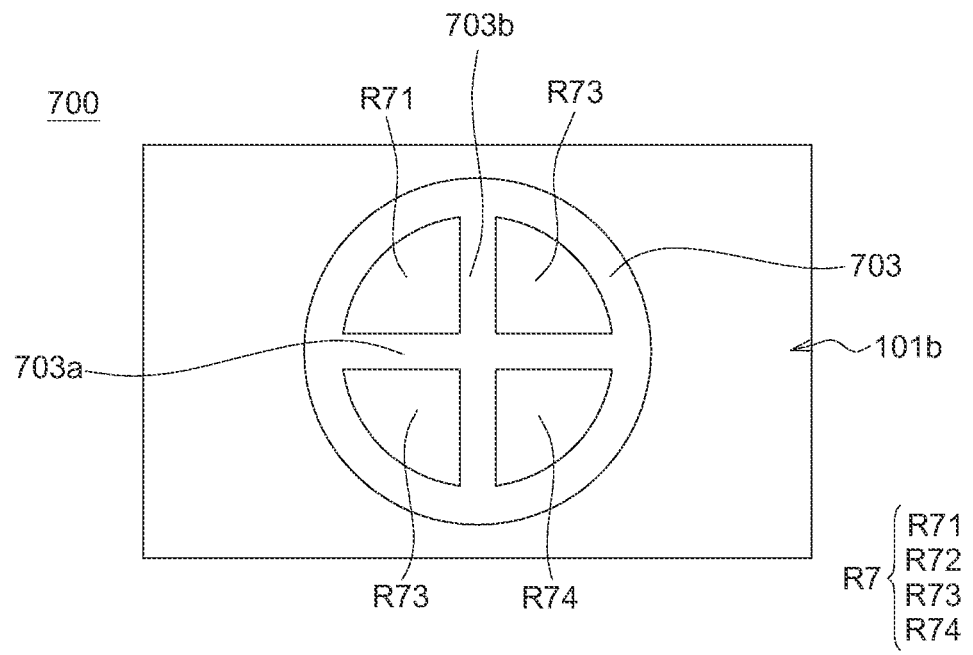
FIG. 7 is a top view of a semiconductor device in accordance with one embodiment of the present disclosure.

Referring to FIG. 7, the structure of the semiconductor device 700 is generally similar to the semiconductor device 600 shown in FIG. 6, except that in the present embodiment, the ring-shaped protrusion 703 of the semiconductor device 700 includes first extending protrusion 703a and second extending protrusion 703b coming cross with each other to divide the region R7 surrounded by the ring-shaped protrusion 703 into a plurality of sub-regions (for example, the sub-regions R71, R72, R73, R74).

It is to be expressly understood that such is only an example of the shape, size and distribution of the ring-shaped protrusions of the semiconductor devices. The ring-shaped protrusions may be of dissimilar shape and/or dimensions. For example, some may be quadrilateral in shape but some may have sides of the same dimension and some may have sides of different dimensions. Included within such shapes are squares, rectangles, parallelogram, rhombus, trapezoids and kite. Alternatively, the ring-shaped protrusions may be defined by a number of sides other than four, such as triangles, pentagons, hexagon, heptagons, and octagons, etc. The ring-shaped protrusions may also be of curved configuration, including circular, elliptical, arched, lens, crescent, oval, quatrefoil, and other curved shapes. Similarly, the shape of the region or sub-region surrounded by the ring-shaped protrusion can also be the above-mentioned shape, which will not be repeated here.

In the process of fabricating the semiconductor devices 200 and 300 as shown in FIGS. 2 to 3, the ring-shaped photoresist 109, used to form the ring-shaped protrusions 203 and 303, includes a ring-shaped portion and an extending portion. The extending portion extends toward inside the ring-shaped portion.

In the process of fabricating the semiconductor devices 400, 500, and 700 as shown in FIGS. 4 to 5 and 7, the ring-shaped photoresist 109, used to form the ring-shaped protrusions 403, 503, and 703, includes a ring-shaped portion and a grid portion, the grid portion is located inside the ring-shaped portion and connected to the ring-shaped portion. As such, the plurality of extending protrusions of the ring-shaped protrusions 403, 503, and 703 could come cross with each other to form a grid structure, and the regions R4, R5, and R7 surrounded by the ring-shaped protrusions 403, 503, and 703 can be divided into a plurality of sub-regions by the grid structure.

Based on the above, in the embodiments of the present disclosure, plasma etching technology is applied to replace the traditional way of relying a cutter (such as a diamond cutter) to cut the semiconductor substrate, whereby the problem of chip collapse due to the stress damage caused by the cutter cutting can be avoided. In addition, by forming a ring-shaped protrusion on the rear surface, the stress resistance of the semiconductor substrate can be improved, which can prevent the semiconductor substrate and the circuit pattern located on the front surface of the semiconductor substrate from being warped due to the adverse impacts caused by the subsequent process, such as bonding stress generated by a wire bonding process or shrinkage stress of the packaging material resulted from a packing process. Whereby a flatter process surface can be provided for the subsequent process and the yield thereof can be thus improved. The semiconductor-based components with ring-shaped protrusions described in the embodiments of this disclosure can be applied to flip-chip products (such as underfill and heatsink) and wire bonding products (such as Epoxy Resin type) and Die Attached Film type (DAF type).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor device, comprising:
  a semiconductor substrate, having a front surface and a rear surface opposed to each other, wherein a vertical wall of the semiconductor substrate connects the front surface to the rear surface; the front surface has a front recess; and a bottom of the front recess connects to the vertical wall;
a circuit structure, located on the front surface; and
a ring-shaped protrusion, protruding on the rear surface and having a height between 20 micrometers and 50 micrometers, wherein an outer outmost edge of the ring-shaped protrusion is separated from the vertical wall for a first distance; and a second distance between a top surface of the ring-shaped protrusion to the front surface is greater than a height of the vertical wall measured from the front surface to the rear surface.

2. The semiconductor device according to claim 1, wherein a ratio of a thickness of the semiconductor substrate to a height of the ring-shaped protrusion is between 10:1 and 5:1.

3. The semiconductor device according to claim 1, wherein an area surrounded by the ring-shaped protrusion at least partially overlaps the circuit structure.

4. The semiconductor device according to claim 1, wherein a shape of the ring-shaped protrusion is square or circular.

5. The semiconductor device according to claim 1, wherein the ring-shaped protrusion further comprises a first extending protrusion extending from an inner edge of the ring-shaped protrusion towards a center of the ring-shaped protrusion.

6. The semiconductor device according to claim 5, wherein two ends of the first extending protrusion are both connected to the inner edge, and a region surrounded by the ring-shaped protrusion is divided into two sub-regions.

7. The semiconductor device according to claim 6, wherein the ring-shaped protrusion further comprises a second extending protrusion, and the region is divided into a plurality of sub-regions by the first extending protrusion and the second extending protrusion.

8. The semiconductor device according to claim 1, wherein the ring-shaped protrusion is arranged in adjacent to the vertical wall of the semiconductor substrate.

9. The semiconductor device according to claim 8, wherein the bottom of the front recess, the vertical wall and a portion of the rear surface jointly define a protrusion.

* * * * *